United States Patent
Chang et al.

(10) Patent No.: US 8,316,280 B2
(45) Date of Patent: Nov. 20, 2012

(54) ERROR CORRECTING DEVICE, METHOD OF ERROR CORRECTION THEREOF, AND MEMORY DEVICE AND DATA PROCESSING SYSTEM INCLUDING OF THE SAME

(75) Inventors: Sil Wan Chang, Gunpo-si (KR); Bum Seok Yu, Suwon-si (KR); Sang Kyoo Jeong, Seoul (KR); Dong Gi Lee, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 296 days.

(21) Appl. No.: 12/720,903

(22) Filed: Mar. 10, 2010

(65) Prior Publication Data

US 2010/0241930 A1    Sep. 23, 2010

(30) Foreign Application Priority Data

Mar. 18, 2009  (KR) .......................... 10-2009-002875

(51) Int. Cl.
 *G11C 29/00* (2006.01)

(52) U.S. Cl. .................... 714/769; 714/763; 714/767

(58) Field of Classification Search .................. None
See application file for complete search history.

(56) References Cited

U.S. PATENT DOCUMENTS

| | | | |
|---|---|---|---|
| 5,781,565 A * | 7/1998 | Sako et al. ...................... | 714/755 |
| 7,213,192 B2 | 5/2007 | James | |
| 7,315,976 B2 * | 1/2008 | Holt .............................. | 714/769 |
| 8,020,115 B2 * | 9/2011 | Borri ............................. | 715/785 |
| 2003/0145270 A1* | 7/2003 | Holt .............................. | 714/766 |
| 2005/0044467 A1* | 2/2005 | Leung et al. ................... | 714/763 |
| 2007/0067677 A1* | 3/2007 | Weiberle et al. ................ | 714/25 |
| 2008/0059662 A1* | 3/2008 | Iwahashi et al. ................ | 710/22 |
| 2008/0163029 A1 | 7/2008 | Hirano et al. | |
| 2008/0184086 A1 | 7/2008 | Kim et al. | |
| 2008/0313524 A1* | 12/2008 | Sawaguchi ..................... | 714/755 |
| 2009/0106509 A1* | 4/2009 | Shim et al. ..................... | 711/154 |
| 2011/0167318 A1* | 7/2011 | Marelli et al. ................. | 714/758 |
| 2011/0283054 A1* | 11/2011 | Kozakai et al. ............... | 711/103 |

FOREIGN PATENT DOCUMENTS

| | | |
|---|---|---|
| JP | 2006-079810 | 3/2006 |
| JP | 2008-165449 | 7/2008 |
| KR | 20080070957 | 8/2008 |

* cited by examiner

*Primary Examiner* — Guerrier Merant
(74) *Attorney, Agent, or Firm* — Stanzione & Kim, LLP

(57) ABSTRACT

An error correction device is provided. The error correction device includes a code storage unit where a plurality of error correction codes are stored, a first error correction unit to correct a data error detected from input data by using one of a plurality of error correction codes and to output correction data, a buffer to store the correction data, and a second error correction unit to generate a new correction code from the correction data, to compare another of a plurality of error correction codes with the new correction code and to output a comparison result.

17 Claims, 4 Drawing Sheets

ERROR CORRECTING DEVICE, METHOD OF ERROR CORRECTION THEREOF, AND MEMORY DEVICE AND DATA PROCESSING SYSTEM INCLUDING OF THE SAME

CROSS-REFERENCE TO RELATED APPLICATIONS

This application claims priority under 35 U.S.C. §119 from Korean Patent Application No. 10-2009-0022875, filed on Mar. 18, 2009, in the Korean Intellectual Property Office, the disclosure of which is incorporated herein in its entirety by reference.

BACKGROUND

1. Field of the Invention

Embodiments of the present general inventive concept relate to an error correcting device, and more particularly, to an error correcting device to secure the integrity of data stored in a Dynamic Random Access Memory (DRAM), an operating method thereof, and a memory device and a data processing system including the same.

2. Description of the Related Art

Recently, devices using a non-volatile memory, e.g., a flash memory, have increased. For example, a MP3 player, a digital camera, a mobile phone, a camcoder, a flash card, a Solid State Drive/Disk (SSD) and so on typically use a non-volatile memory as a storage device.

A storage device using a flash memory performs a write command by receiving data from a host and storing it in a flash memory. Here, the program time for storing transmitted data in a flash memory is more than transmission time for transmitting data from a host to a flash memory of a storage device. Accordingly, the storage device further includes a volatile memory, e.g., a DRAM, having a quicker program time than a flash memory, and data supplied from the host is stored in a DRAM temporarily. However, using such a DRAM further requires not only more physical space where data is stored, but also a data processing scheme for securing integrity of data stored in the DRAM.

SUMMARY

The present general inventive concept provides an error correction device to secure the integrity of stored data, an operation method of the error correction device, a memory device including the error correction device, and a data processing system including the memory device.

Additional features and utilities of the present general inventive concept will be set forth in part in the description which follows and, in part, will be obvious from the description, or may be learned by practice of the general inventive concept.

Example embodiments of the present general inventive concept provides an error correction device, including a code storage unit where a plurality of error correction codes are stored, a first error correction unit to correct a data error detected from input data by using one of a plurality of error correction codes and to output correction data, a buffer to store the correction data, and a second error correction unit to generate a new correction code from the correction data, to compare another of a plurality of error correction codes with the new correction code and to output a comparison result. The buffer outputs the correction data to update input data according to the comparison result output from the second error correction unit.

Example embodiments of the present general inventive concept also provide a method of operating an error correction device, including correcting a data error detected from input data by using a first correction code among a plurality of error correction codes, generating a new correction code from correction data and comparing a second correction code among a plurality of error correction codes and the new correction code, and outputting the correction data according to a result of the comparing the second correction code and the new correction code.

Example embodiments of the present general inventive concept also provide a memory device, including a memory where input data input from outside is stored and an error correction device to correct a data error detected from input data.

Example embodiments of the present general inventive concept also provide a data processing system, including a host, a data processing device, and an error correction device to correct a data error detected from the input data.

Example embodiments of the present general inventive concept also provide a method of error correction, the method including receiving input data with a error correction device and detecting a data error in the input data with a first error correction unit, correcting the detected data error with a first error correction code stored in the first error correction unit that stores a plurality of error correction codes, generating a second correction code from the correction data with a second error correction unit, comparing a second correction code of the plurality of error correction codes with the new correction code with a comparison unit, and updating the received input data with the correction data output according to the comparing the second correction code and the new correction code.

Example embodiments of the present general inventive concept also provide a method of operating data processing system, the method including receiving data with a data processing device from a host, detecting a data error in the input data with the data processing device, correcting the detected data error with a first error correction code, generating a second correction code from the correction data with the data processing device, comparing a second correction code of the plurality of error correction codes with the new correction code with the data processing device, and updating the received input data with the correction data output according to the comparing the second correction code and the new correction code.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
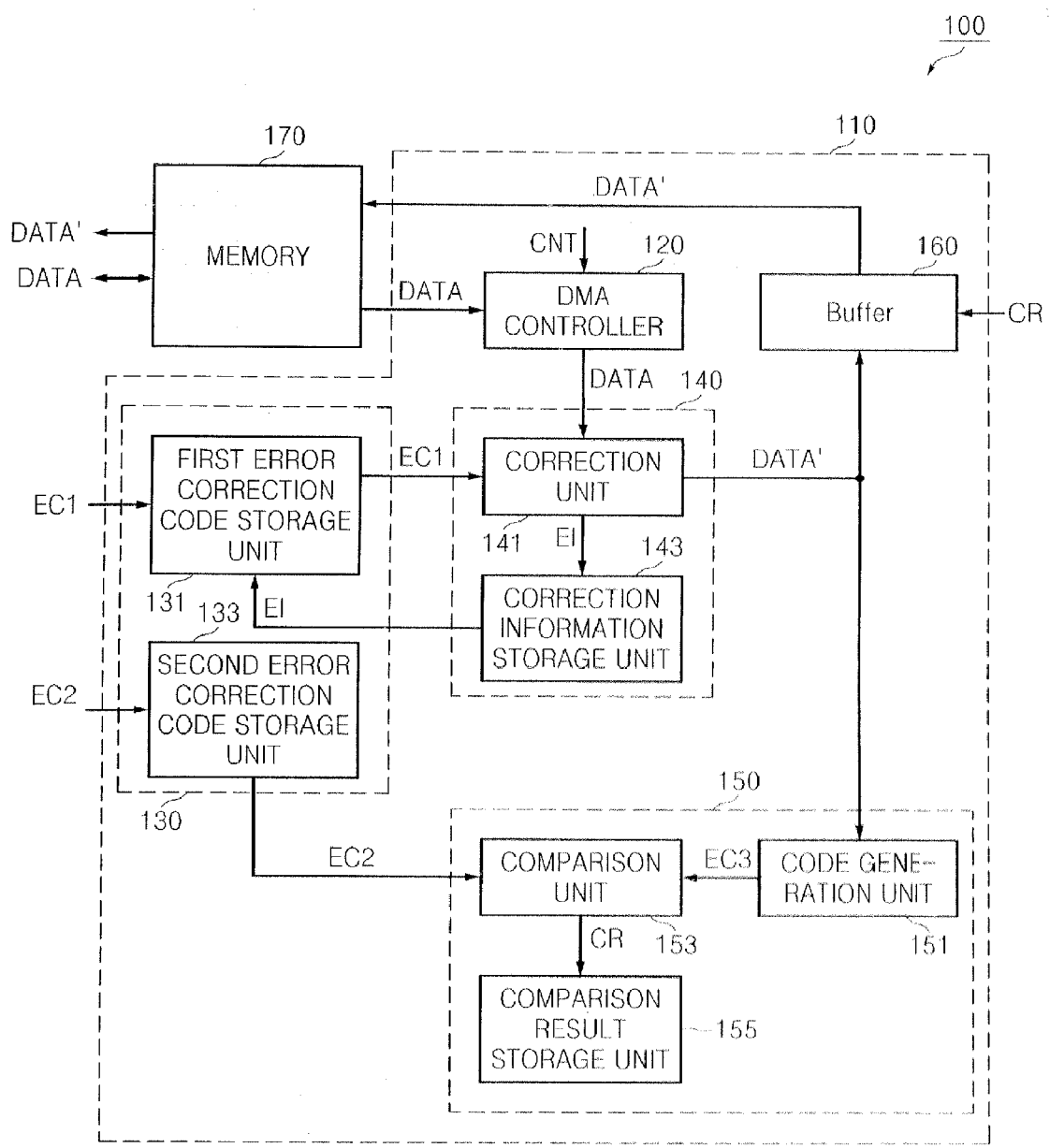
FIG. 1 is a schematic block diagram illustrating a memory device according to example embodiments of the present general inventive concept.

Reference will now be made in detail to the example embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a schematic block diagram of a memory device 100 according to example embodiments of the present general inventive concept. The memory device 100 may be a volatile memory device, e.g., a Dynamic Random Access Memory (DRAM) or a Static Random Access Memory (SRAM). For ease and clarity of explanation, the exemplary memory device described below is a DRAM. However, the memory device may also be a SRAM, or any other suitable type of memory device to carry out the exemplary embodiments of the present general inventive concept.

Referring to FIG. 1, the memory device 100 may include a memory 170 and an error correction device 110. Input data DATA input from outside, e.g., an external device that may be communicatively coupled to the memory 170 such as a host (not illustrated), may be stored in the memory 170. The memory 170 may be a volatile memory which loses stored input data DATA when a power is shut down. Accordingly, input data DATA input from outside may be stored in the memory 170. Under control of a controller (not illustrated) such as a CPU (central processing unit), the input data DATA stored may be output as output data DATA to an external memory, e.g., a non-volatile memory (not illustrated), or any other suitable memory device to carry out the exemplary embodiments of the present general inventive concept.

The memory 170 may store input data DATA by using one or more of a plurality of cache lines defined inside. For example, the memory 170 may store input data DATA (e.g., successively) in each of a plurality of cache lines and output the input data DATA stored in one or more of the plurality of cache lines to an external memory.

The memory 170 may include a clean cache line and a dirty cache line. The clean cache line may indicate a state that input data DATA stored in a cache line is output and stored to an external memory. The dirty cache line indicate a state that input data DATA stored in a cache line is not output to an external memory, i.e., a state that input data DATA is stored in a memory 170.

An error correction device 110 of a memory device 100 may perform an error correction operation in a dirty cache line state of the memory 170, i.e., in a state that input data DATA is stored in the memory 170.

The error correction device 110 may include a Direct Access (DMA) controller 120, a code storage unit 130, a first error correction unit 140, a second error correction unit 150, and a buffer 160. The error correction device 110 may detect and correct an error of input data DATA in a dirty cache line status of the memory 170. The error correction device 110 may detect the error in the input data with repetition codes, parity bits, checksums, cyclic redundancy checks, error correction codes, any combination thereof, or any other suitable error detection methods that would carry out the exemplary embodiments of the present general inventive concept.

The DMA controller 120 may control operations of the error correction device 110 according to a control signal CNT. For example, the DMA controller 120 may receive a control signal CNT, indicating that the memory device 100 is in a standby state where it doesn't currently perform an operation, from an external controller such as a CPU. The DMA controller 120 may control operations of an error correction device 110 without control of an external controller according to a control signal CNT. For example, the DMA controller 120 may read input data DATA from the memory 170 and output it to the first error correction unit 140 according to the control signal CNT.

That is, the error correction device 110 may correct an error of the input data DATA according to an operational control of the DMA controller 120 during idle time of the memory device 100, or at any other suitable time that would carry out the exemplary embodiments of the present general inventive concept.

The code storage unit 130 may store a plurality of error correction codes, e.g., a first correction code EC1 and a second correction code EC2, input from outside (e.g., received from a host device) and/or programmed into the code storage unit 130. The code storage unit 130 may include at least a first error correction code storage unit 131 and a second error correction code storage unit 133. Although FIG. 1 illustrates the first and second error correction code storage units 131 and 133 for the sake of clarity, more than two error correction code storage units may be included in the code storage unit 130. The first correction code EC1 may be stored in the first error correction code storage unit 131 and the second correction code EC2 may be stored in the second error correction code storage unit 133.

The first correction code EC1 and the second correction code EC2 may correspond to the input data DATA input to the memory 170. For example, the first correction code EC1 and the second correction code EC2 may be composed of codes corresponding to input data DATA by an external controller and supplied to the memory device 100 with input data DATA from outside.

The first correction code EC1 may be an Error Correction Code (ECC) and the second correction code EC2 may be a Cyclic Redundancy Check (CRC) code.

The code storage unit 130 may output one or more of a plurality of error correction codes stored under control of the DMA controller 120. For example, the first error correction code storage unit 131 of the code storage unit 130 may output the first correction code EC1 to the first error correction unit 140. The second error correction code storage unit 133 of the code storage unit 130 may output the second correction code EC2 to the second error correction unit 150.

The first error correction unit 140 may include a correction unit 141 and a correction information storage unit 143. The correction unit 141 may receive input data DATA that the DMA controller 120 reads from the memory 170 and may detect a data error of the input data DATA. The correction unit 141 may correct a data error detected by using at least one of a plurality of error correction codes, e.g., the first correction code EC1, output from the code storage unit 130.

The data error detected from the input data DATA may be a data error generated when input data DATA is stored in the memory 170 from outside or a data error generated when the DMA controller 120 reads the stored input data DATA from the memory 170.

The correction unit 141 may correct a data error, which is generated in input data DATA supplied through the DMA controller 120, by using the first correction code EC1 supplied from the first error correction code storage unit 131, or by using any other suitable correction code provided by the first error correction code storage unit 131 or the second error correction code storage unit 133. The correction unit 141 may perform a correction operation by using the first correction code EC1, even when a data error detected from the input data DATA is a data error lower than a predetermined correction level. The correction unit 141 may output correction data DATA', where a data error is corrected. The correction data DATA' may be output to a second error correction unit 150 or a buffer 160.

The correction information storage unit 143 may store correction information El of the correction unit 141, i.e., correction information that a data error of input data is corrected by using the first correction code EC1. The correction information storage unit 143 may feedback the stored correction information ECI to a code storage unit 130, i.e., the first error correction code storage unit 131, and update the first correction code EC1 stored in a first error correction code storage unit 131.

The second error correction unit 150 may include a code generation unit 151, a comparison unit 153, and a comparison result storage unit 155. The code generation unit 151 may generate a new correction code, e.g., a third correction code EC3, by receiving correction data DATA' output from the first error correction unit 140. A generated third correction code EC3 may be output to the comparison unit 153. The third correction code EC3 may be, for example, a CRC code, which corresponds to correction data DATA' and is generated from the code generation unit 151.

The comparison unit 153 may compare a third correction code EC3 supplied from the code generation unit 151 with the second correction code EC2 supplied from the second error correction code storage unit 133 of the code storage unit 130, and output a comparison result. The comparison unit 153 may output the comparison result CR to a buffer 160 and the buffer 160 may output correction data DATA' to outside, e.g., the memory 170, according to the comparison result CR of the comparison unit 153.

The comparison result storage unit 155 may store the comparison result CR of the comparison unit 153. According to example embodiments of the present general inventive concept, the comparison result storage unit 155 may feedback the comparison result CR stored in the comparison result storage unit 155 to the second error correction code storage unit 133 and update the second correction code EC2 stored in the second error correction code storage unit 133.

The buffer 160 may store correction data DATA' output from the first error correction unit 140 and output the correction data DATA' to the memory 170 according to a comparison result CR output from the second error correction unit 150. The memory 170 may update corresponding input data DATA according to correction data DATA' output from the buffer 160. The memory 170 may also output updated correction data DATA' to an external memory, e.g., a non-volatile memory or any other suitable memory device.

Figure 2:
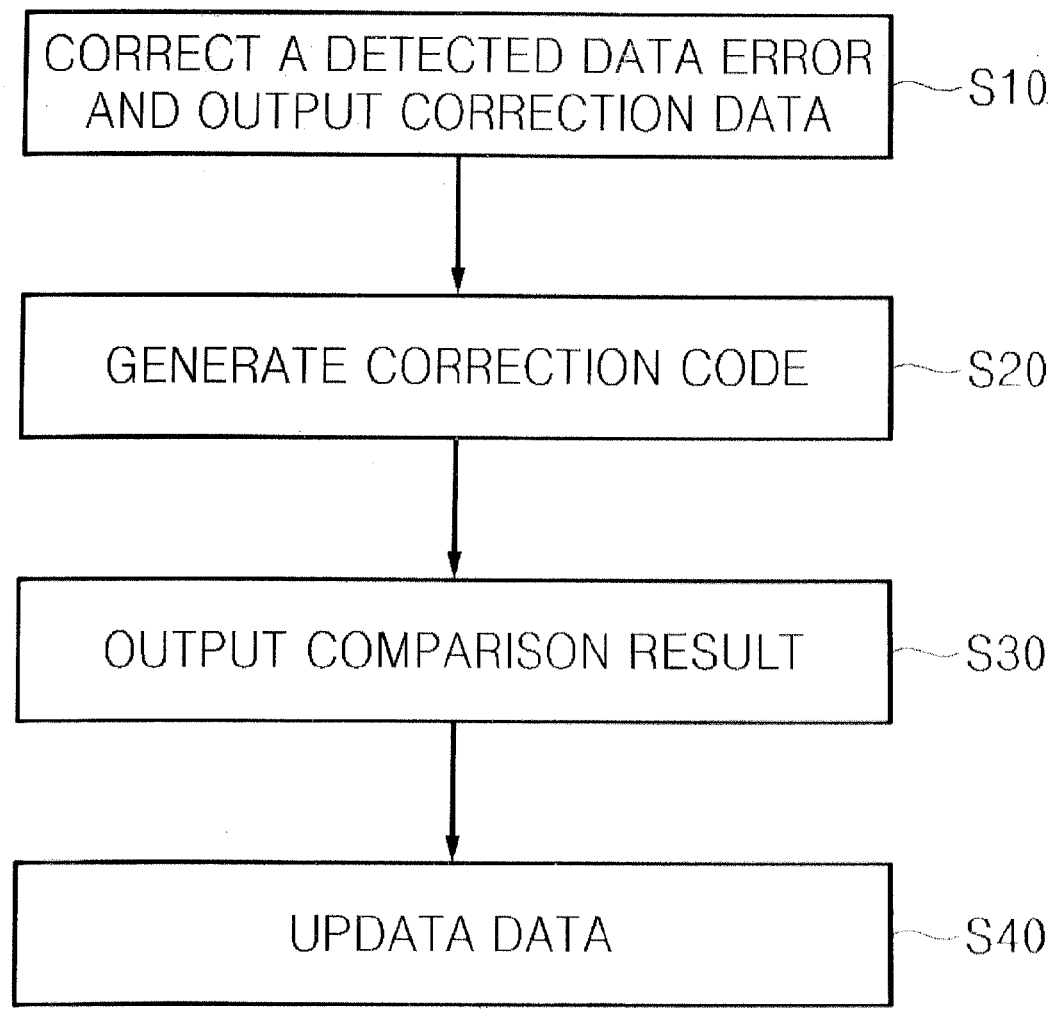
FIG. 2 is an error correction operation flowchart of a memory device illustrated in FIG. 1.

FIG. 2 is an error correction operational flowchart of a memory device illustrated in FIG. 1. Referring to FIGS. 1 and 2, a memory device 100 may receive input data DATA from outside and store it in a memory 170. The code storage unit 130 of the memory device 100 may receive and store a plurality of error correction codes, e.g., a first correction code EC1 and a second correction code EC2, which corresponds to input data DATA, from outside (e.g., a host).

The DMA controller 120 may read input data DATA stored in the memory 170 and output the read input data DATA to a first error correction unit 140 according to a control signal CNT. The first error correction unit 140 may detect a data error from input data DATA input through the DMA controller 120.

When a data error of the input data DATA is detected, the first error correction unit 140 may correct a detected data error by using a correction code, e.g., a first correction code EC1, output from a code storage unit 130. The first error correction unit 140 may store correction information El of the input data DATA in a corrected information storage unit 143 and output correction data DATA' to a buffer 160 or a second error correction unit 150 (operation S10).

The correction information storage unit 143 may feedback correction information E1 to a code storage unit 130, and a first error correction code storage unit 131 of the code storage unit 130 may update the first correction code EC1 according to the correction information E1. For example, when a correction unit 141 corrects a data error detected from input data DATA by using the first correction code EC1 and generates correction data DATA' accordingly, the correction information storage unit 143 may store the correction information E1 of the input data DATA.

When an operation of an error correction device 110 is performed, e.g., the buffer 160 feedbacks the correction data DATA' to the memory 170 and updates the input data DATA, the stored correction information E1 may be feedback to the first error correction code storage unit 131 of the code storage unit 130. The first error correction code storage unit 131 may update the first correction code EC1 according to the feedback correction information E1. The second error correction unit 150 may generate a new third correction code EC3 from correction data DATA' output from the first error correction unit 140 (operation S20). The third correction code EC3 may be a CRC code corresponding to correction data DATA'.

The comparison unit 153 may compare the generated third correction code EC3 with the second correction code EC2, supplied from a code storage unit 130, and output a comparison result CR. For example, the comparison unit 153 may output a comparison result CR having a first level, e.g., a high level, when the third correction code EC3 and the second correction code EC2 are the same. Additionally, the comparison unit 153 may output a comparison result CR having a second level, e.g., a low level, when the third correction code EC3 and the second correction code EC2 are not the same.

The comparison result CR output from the comparison unit 153 can be input to the buffer 160 and the buffer 160 may output correction data DATA' stored according to the comparison result CR to the memory 170 (operation S30). For example, when the comparison unit 153 outputs a comparison result CR having a high level, i.e., when the generated third correction code EC3 and the second correction code EC2 are the same, the correction unit 141 of the first error correction unit 140 may correct a data error of input data DATA by using the first correction code EC1 and the buffer may output stored correction data DATA' to the memory 170.

The memory 170 may update the input data DATA according to the correction data DATA' output from the buffer 160 (operation S40). For example, the buffer 160 may feedback correction data DATA' directly to a cache line where corresponding input data DATA of the memory 170 is stored, and the memory 170 may update input data DATA according to the feedback correction data DATA'. The buffer 160 may feedback the correction data DATA' to an additional cache line (e.g., a reserved cache line) of the memory 170, and the memory 170 may update input data DATA by mapping the correction data DATA' which is feedback to the reserved cache line to an original cache line, i.e., a cache line where input data corresponding to the correction data DATA' is stored.

When the comparison unit 153 outputs a comparison result CR having a second level, i.e., when the generated third correction code EC3 and the second correction code EC2 are not the same, the correction unit 141 of the first error correction unit 140 may indicate that there is a data error which may not be corrected by the first correction code EC1 at input data DATA, and the buffer 160 does not output a stored correction data DATA' to the memory 170. The correction data DATA' stored in the buffer 160 may be discarded.

The steps S10 to S40 of the error correction device described above may be performed during idle time of the memory device 100 by the DMA controller 120, or at any other suitable time that would carry out the exemplary embodiments of the present general inventive concept.

Figure 3:
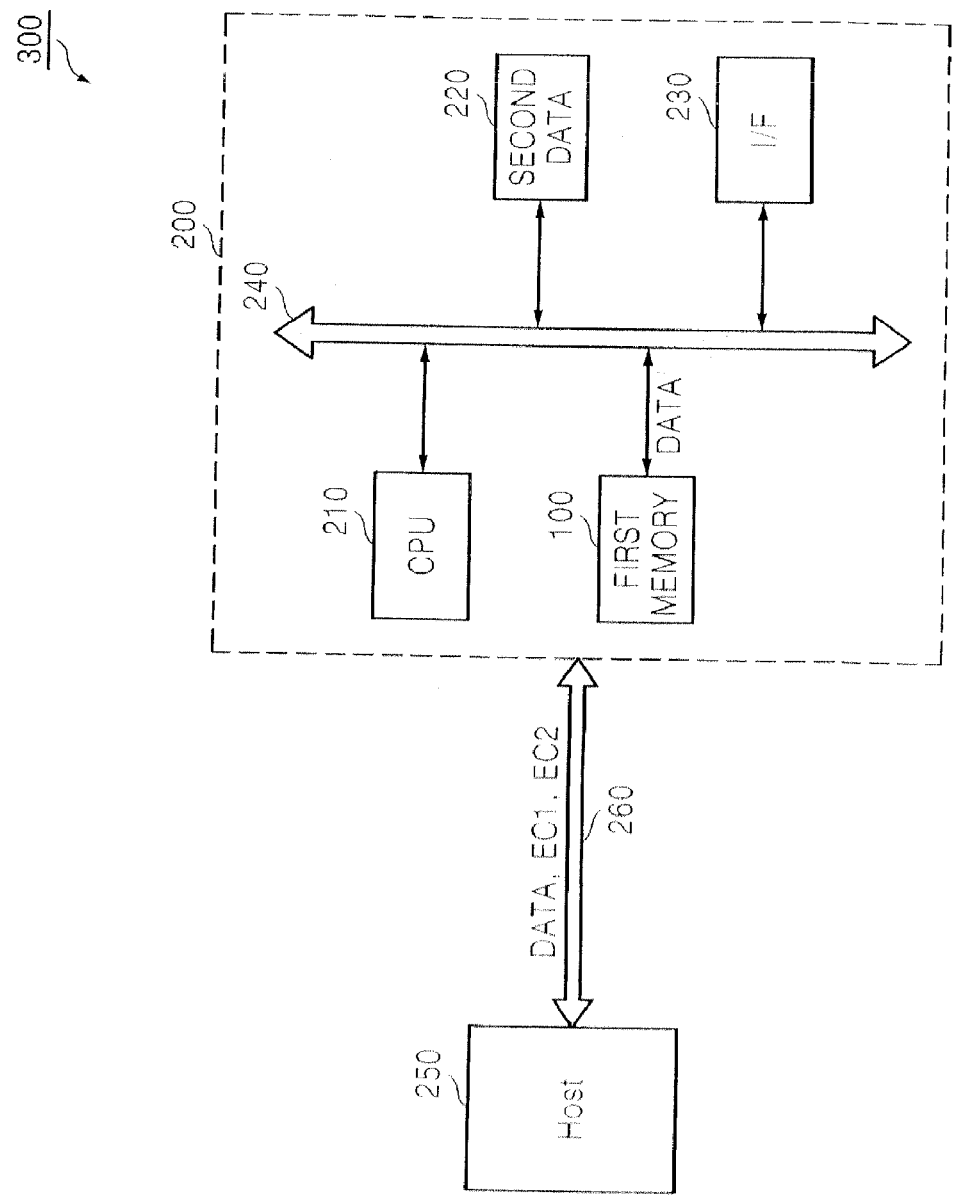
FIG. 3 is a schematic block diagram of a data processing system including a memory device illustrated in FIG. 1.

Referring now to FIG. 3, a data processing device and a data processing system including a memory device of the present general inventive concept is described. FIG. 3 is a schematic block diagram of a data processing system including the memory device illustrated in FIG. 1

Referring to FIGS. 1 and 3, a data processing system 300 may include a host 250 and a data processing device 200. The data processing device 200 may include the above-described memory device 100. The data processing device 200 may be a storage device for storing data DATA output from outside, e.g., the host 250. The data processing device 200 may be used in a personal terminal and/or personal computer (PC) such as a computer system, a terminal device system, an input/output device system, a hard disk recorder (HDD recorder), a cellular phone, a PDA (personal digital assistant) and so on, a computer (PC, laptop PC, desktop PC, note-book, net-book and so on), a navigator device, a home automation system, a music player (MP3 player and so on), a camcoder, an image player, a storage server, a portable multimedia player (PMP), a Solid State Drive/Disk(SSD) or a memory card including a smart card.

For the sake of clarity, the data processing system 300 is described in detail below as a computer system, and the data processing device 200 is used in the SSD.

Referring to FIGS. 1 and 3, the host 250 may exchange data DATA when communicating with a data processing device 200 through a communication network 260. The host 250 and the data processing device 200 may exchange a plurality of error correction codes, e.g., a first correction code EC1 and a second correction code EC2, along with data DATA through the communication network 260. Here, the first correction code EC1 may be an ECC and the second correction code EC2 may be a CRC code.

Although not illustrated, the host 250 may include a CPU (not illustrated) and a memory (not illustrated), and a memory of the host 250 may be the same as or similar to the first memory 100 of the data processing device 200, i.e., the memory device 100 illustrated in FIG. 1 and described above. That is, a memory of the host 250 may include the error correction device 110 illustrated in FIG. 1 and described in detail above. Accordingly, the host 250 may correct an error of data DATA and transmit the data DATA of integrity before transmitting the data DATA to the data processing device 200 through the communication network 260, and may store the data DATA of integrity after correcting an error of the data DATA transmitted through the communication network 260 from the data processing device. The communication network 260 may be either a wired or a wireless communication network 260, or any suitable combination thereof.

The data processing device 200 may include a CPU 210, a first memory 100, a second memory 220, and an interface I/F 230. Although it is not illustrated, the data processing device 200 may further include a battery (not illustrated) to supply power to the CPU 210, the first memory 100, the second memory 220, the interface 230, etc.

The CPU 210 may generate a control signal to control an operation of a first memory 100, a second memory 220 and an interface 230, and output the control signal to the first memory 100, the second memory 220 and the interface 230 through a bus 240. The first memory 100 may be a memory device 100 including a memory 170 and an error correction device 110 illustrated in FIG. 1, and detailed explanation thereof is provided above. The first memory 100 may correct an error of data DATA transmitted from the host 250 and output corrected data DATA'.

The second memory 220 may receive the correction data DATA' that error correction is completed by the first memory 100 through the bus 240 and store it. The second memory 170 may be a non-volatile memory such as a NAND type flash memory device or a NOR type flash memory device. The interface 230 may be an input/output interface and may send and/or receive data where the data processing device 200 communicates with the host 250 by connecting to the communication network 260.

Figure 4:
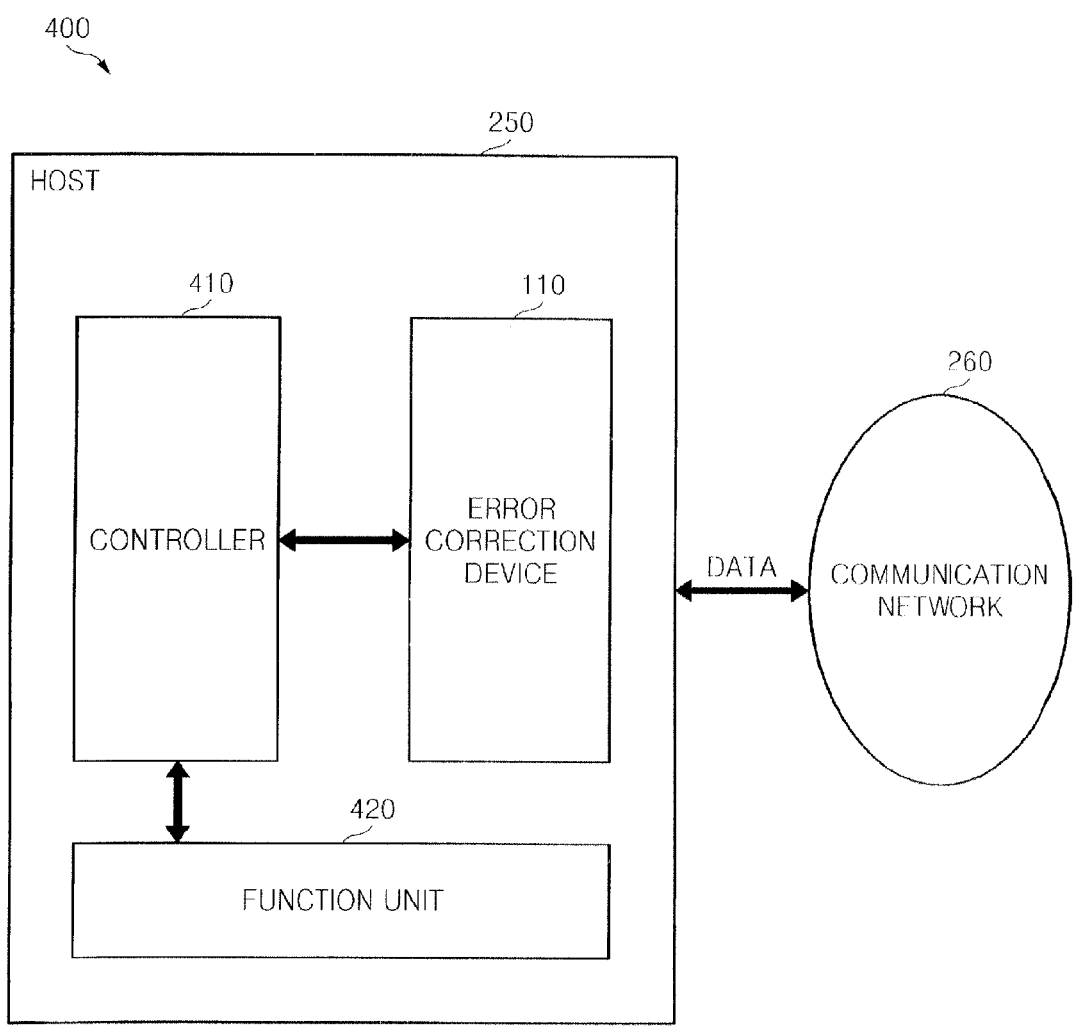
FIG. 4 illustrates a data processing system including an error correction device illustrated in FIG. 1 and a function unit according to exemplary embodiments of the present general inventive concept.

FIG. 4 illustrates a data processing system 400 that can include a host 250, a controller 410, and error correction device 110, and a function unit 420. The host 250 may be communicative coupled to a wired or wireless communication network 260, and the host 260 may transmit and/or receive data from one or more devices (not illustrated) communicatively coupled to the communication network 260. For example, the host 250 may receive data from the communication network 260, and the controller 410 may control the error correction device 110 (as illustrated in detail in FIG. 1 and described above). The error correction device 110 of the host 250 may correct an error of data DATA received from the communication network 260 such that the data DATA has integrity before transmitting the data DATA to the function unit 420. The function unit 420 may be an audio data process, video data processor, or any suitable combination thereof that may receive the data DATA and may generate an audio signal, video signal, and/or an audio-visual signal with the DATA to be transmitted to a device communicatively coupled directly to the host or via the communication network 260.

According to an error correcting device, an operational method thereof, and a memory device and a data processing system including of the same according to example embodiments of the present general inventive concept, integrity of stored data may be secured by detecting and correcting a data error even through the data error lower than a correction level is occurred in the stored data. By performing such data error detection and correcting operation during idle time of a memory device, increases of latency for request of a host may be suppressed.

Although several embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. An error correction device comprising:
a code storage unit to store a plurality of error correction codes;
a first error correction unit to correct a data error detected from input data by using one of the plurality of error correction codes and to output correction data;
a buffer to store the correction data; and
a second error correction unit to generate a new correction code from the correction data, to compare another of the plurality of error correction codes with the new correction code and to output a comparison result,
wherein the buffer outputs the correction data to update the input data according to the comparison result output from the second error correction unit.

2. The error correction device of claim 1, wherein the plurality of error correction codes comprises:
a first correction code and a second correction code,
wherein the first error correction unit includes:
a correction unit to detect the data error from the input data, to correct the data error by using the first correction code, and to output the correction data; and
a correction information storage unit to store correction information of the input data.

3. The error correction device of claim 2, wherein the code storage unit updates the first correction code according to the correction information.

4. The error correction device of claim 1, wherein the plurality of error correction codes comprise:
a first correction code and a second correction code,
wherein the second error correction unit includes:
a correction code generation unit to generate the new correction code from the correction data;
a comparison unit to compare the second correction code with the new correction code and to output the comparison result; and
a comparison result storage unit to store the comparison result.

5. The error correction device of claim 1, wherein the plurality of error correction codes are error correction codes (ECC) or cyclic redundancy check (CRC) codes.

6. The error correction device of claim 1, wherein the error correction device further comprises a direct memory access (DMA) controller to control an operation of the error correction device according to an input control signal.

7. A memory device comprising:
a memory to store input data; and
an error correction device to correct a data error detected from the input data, including:
a code storage unit to store a plurality of error correction codes;
a first error correction unit to correct a data error detected from the input data by using one of the plurality of error correction codes and to output correction data;
a buffer to store the correction data; and
a second error correction unit to generate a new correction code from the correction data, to compare another of the plurality of error correction codes with the new correction code and to output a comparison result,
wherein the buffer outputs the correction data to update the input data according to the comparison result output from the second error correction unit.

8. The memory device of claim 7, wherein the memory device is a dynamic random access memory (DRAM) or a static random access memory (SRAM).

9. The memory device of claim 7, wherein the error correction device operates during idle time of the memory device.

10. The memory device of claim 7, wherein the plurality of error correction codes comprises:
a first correction code and a second correction code,
wherein the first error correction unit includes:
a correction unit to detect the data error from the input data, to correct the data error by using the first correction code and to output the correction data; and
a correction information storage unit to store correction information of the input data.

11. The memory device of claim 10, wherein the code storage unit updates the first correction code according to the correction information.

12. The memory device of claim 7, wherein the plurality of error correction codes comprise:
a first correction code and a second correction code,
wherein the second error correction unit includes:
a correction code generation unit to generate the new correction code from the correction data;
a comparison unit to compare the second correction code with the new correction code and to output the comparison result; and
a comparison result storage unit to store the comparison result.

13. A data processing system comprising:
a host; and
a data processing device to communicate with the host,
wherein the data processing device comprises:
a first memory to correct a data error that is detected from input data input from the host, and to output corrected data; and
a second memory to receive and store the corrected data from the first memory,
wherein the first memory comprises:
a memory where the input data is stored; and
an error correction device to correct a data error detected from the input data, including:
a code storage unit to store a plurality of error correction codes;
a first error correction unit to correct a data error detected from the input data by using one of the plurality of error correction codes and to output correction data;
a buffer to store the correction data; and
a second error correction unit to generate a new correction code from the correction data, to compare another of the plurality of error correction codes with the new correction code and to output a comparison result,
wherein the buffer outputs the correction data to update the input data according to the comparison result output from the second error correction unit.

14. The system of claim 13, wherein the data processing device is a solid state drive (SSD).

15. The system of claim 13, wherein the plurality of error correction codes comprises:
a first correction code and a second correction code,
wherein the first error correction unit includes:
a correction unit to detect the data error from the input data, to correct the data error by using the first correction code and to output the correction data; and
a correction information storage unit to store correction information of the input data.

16. The system of claim 15, wherein the code storage unit updates the first correction code according to the correction information.

17. The system of claim 13, wherein the plurality of error correction codes comprises:
a first correction code and a second correction code,
wherein the second error correction unit includes:
a correction code generation unit to generate the new correction code from the correction data;
a comparison unit to compare the second correction code with the new correction code and outputting the comparison result; and
a comparison result storage unit to store the comparison result.

* * * * *